United States Patent

Yoshizawa et al.

[11] Patent Number: 6,005,420
[45] Date of Patent: *Dec. 21, 1999

[54] FREQUENCY MULTIPLYING CIRCUIT HAVING A GREATER MULTIPLYING RATIO

[75] Inventors: Akihiko Yoshizawa, Yokohama; Shuichi Takada, Kawasaki, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/825,571

[22] Filed: Mar. 31, 1997

[30] Foreign Application Priority Data

Apr. 1, 1996 [JP] Japan ..................... 8-078854

[51] Int. Cl.$^6$ .................... H03B 19/00

[52] U.S. Cl. .......... 327/116; 327/119; 327/158; 327/162

[58] Field of Search .................... 327/116, 119, 327/114, 156, 158, 159, 162, 163, 355, 361; 377/47, 48

[56] References Cited

U.S. PATENT DOCUMENTS

| 4,491,805 | 1/1985 | Laures et al. ............... 331/18 |
| 4,806,879 | 2/1989 | Troxel ........................ 331/2 |
| 4,956,797 | 9/1990 | Berard ....................... 364/703 |
| 5,463,337 | 10/1995 | Leonowich .................. 327/158 |
| 5,530,387 | 6/1996 | Kim ........................... 327/119 |

FOREIGN PATENT DOCUMENTS

| 0 441 684 | 8/1991 | European Pat. Off. . |
| 0 477 582 | 4/1992 | European Pat. Off. . |

OTHER PUBLICATIONS

Patent Abstracts of Japan, vol. 095, No. 011, Dec. 26, 1995, JP–A–07 202649, Aug. 4, 1995.

Primary Examiner—Kenneth B. Wells
Assistant Examiner—Hai L. Nguyen
Attorney, Agent, or Firm—Oblon, Spivak, McClelland, Maier & Neustadt, P.C.

[57] ABSTRACT

A frequency multiplying circuit includes a plurality of frequency multipliers in a series array. The multiplying ratio of the initial stage frequency multiplier is the greatest compared with the remaining frequency multiplier or multipliers. Further, at least one of the frequency multipliers uses a voltage controlled delay circuit.

20 Claims, 4 Drawing Sheets

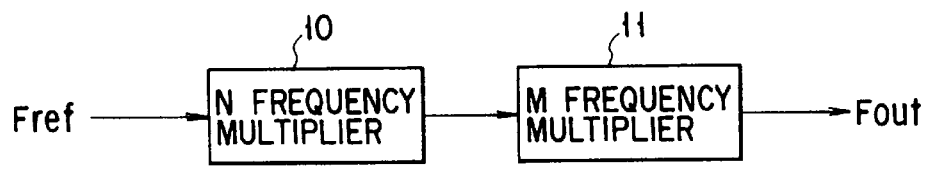
F I G. 1
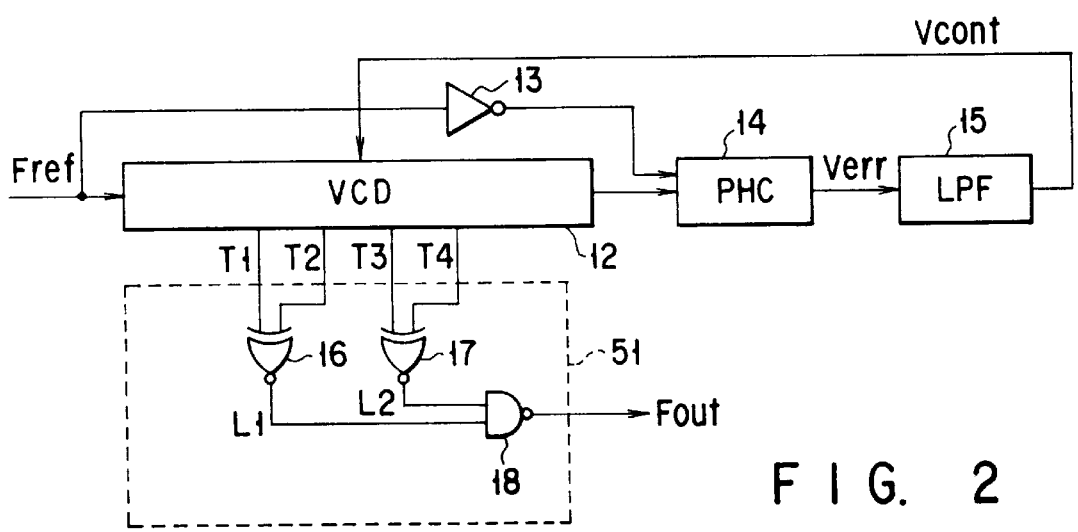
F I G. 2
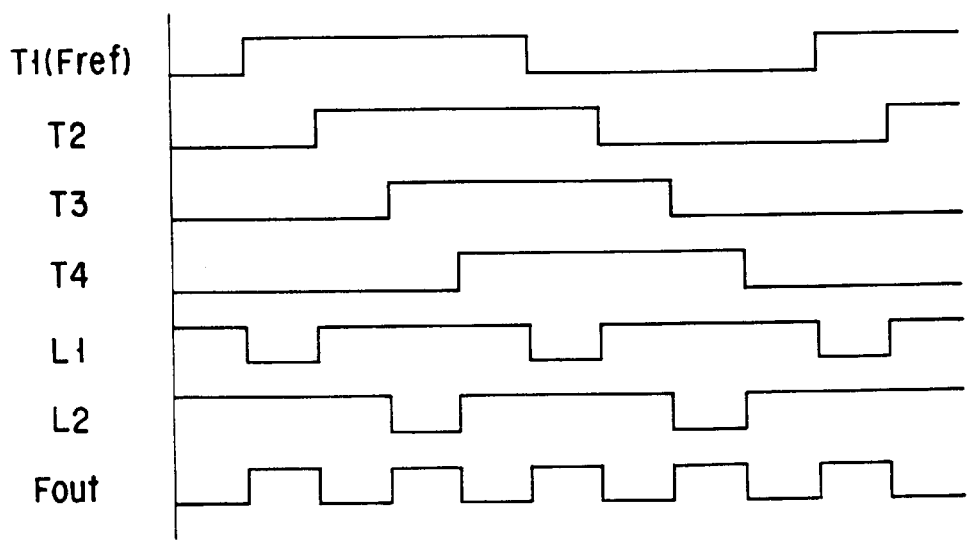
F I G. 3

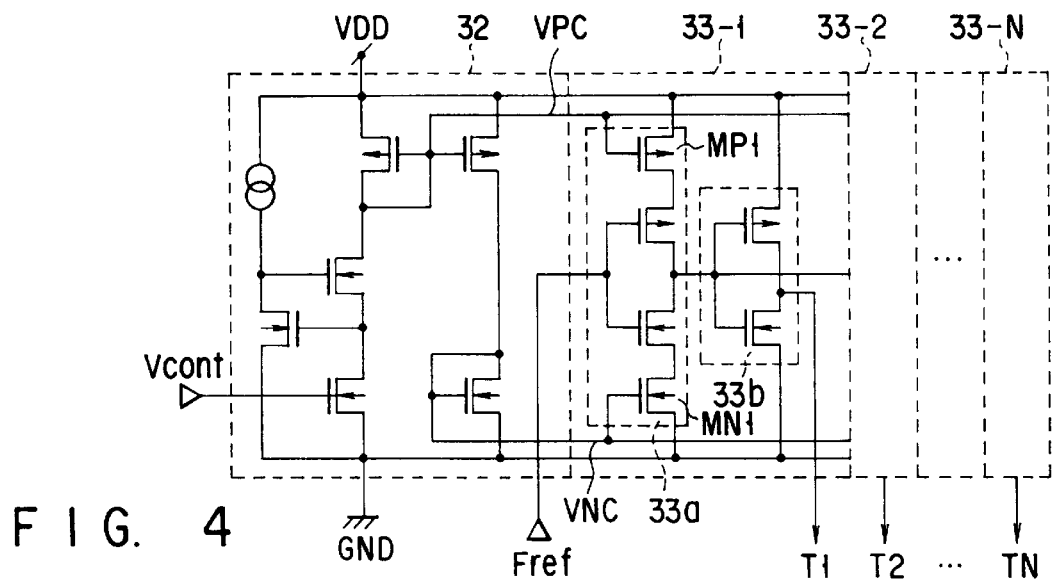
F I G. 4
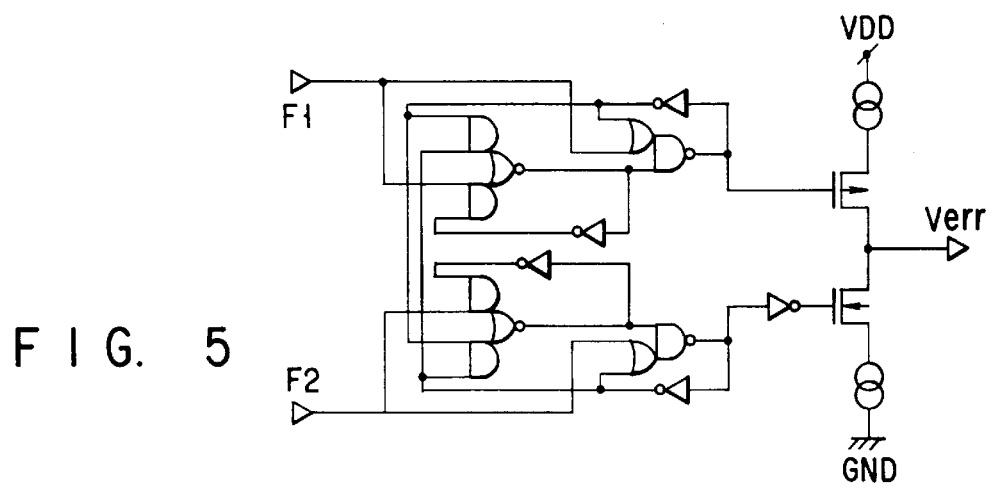
F I G. 5
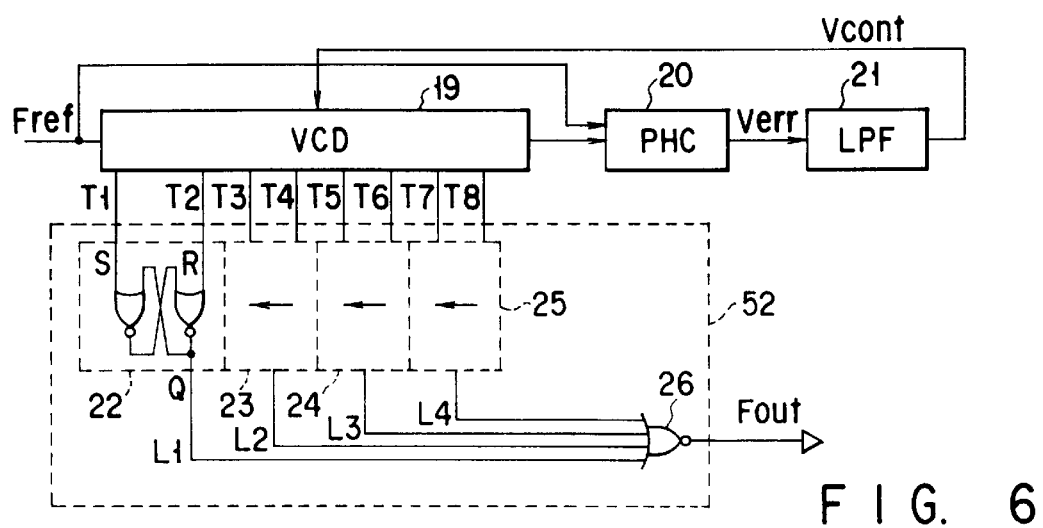
F I G. 6

FREQUENCY MULTIPLYING CIRCUIT HAVING A GREATER MULTIPLYING RATIO

BACKGROUND OF THE INVENTION

The present invention relates to a frequency multiplying circuit having a greater multiplying ratio and, in particular, to a circuit having a multiplying ratio of a few thousands of times as great and ensuring less jitter and high stability.

FIG. 11 shows a conventional frequency multiplying circuit using a phase locked loop (PLL) circuit. An oscillation signal Fout output from a voltage controlled oscillator (VCO) 3 is supplied to an input terminal of a frequency divider (DIV) 4. The frequency divider 4 generates a divided signal Fout/N obtained by frequency-dividing the oscillation signal Fout by N. The divided signal Fout/N is supplied to a first input terminal of a phase comparator (PHC) 1. A reference signal Fref is supplied to a second input terminal of a phase comparator 1. The phase comparator 1 produces an error signal Verr corresponding to a phase difference between the divided signal Fout/N and the reference signal Fref. The error signal Verr is supplied to an input terminal of a lowpass filter (LPF) 2. The lowpass filter 2 integrates the error signal Verr and supplies a corresponding DC level output signal Vcont to a control voltage input terminal of the VCO 3.

The operation of the resultant circuit will now be explained below.

If the frequency of the signal Fout/N is lower than that of the reference signal Fref, the phase comparator 1 outputs a low level signal only during a time period in which the phase of the signal Fout/N is delayed behind the reference signal Fref. In the case where a lowpass filter 2 is comprised of an active filter to which negative feedback is applied, the output level of the lowpass filter 2 goes higher than its previous level and the VCO 3 oscillates with a frequency higher than its previous frequency. If the frequency of a divided signal Fout/N of a resultant oscillation signal Fout is lower than that of the reference signal Fref, then the VCO 3 oscillates with a still higher frequency through the same process. If, on the other hand, the frequency of the signal Fout/N goes higher than that of the reference signal Fref, the phase comparator 1 outputs a high level signal only during a time period equal to a phase difference between the divided signal Fout/N and the signal Fref. The corresponding high level pulse is integrated by the lowpass filter 2 and the output level of the lowpass filter 2 goes lower than its previous level. As a result, the VCO 3 oscillates with a frequency lower than its previous oscillation frequency. In this way, comparison is made any plurality of times between the signal Fout/N and the reference signal Fref and a loop operates ceaselessly without producing any phase difference. When the phase difference between the signal Fout/N and the reference signal Fref becomes zero, then the output of the phase comparator 1 becomes a high impedance state and the output of the lowpass filter 2 maintains the same level as its previous level. As a result, the VCO 3 oscillates with the same frequency as its previous oscillation frequency. If such a stable state is reached, then the output frequency Fout of the PLL circuit is given by:

$$Fout = Fref \times N$$

where Fref denotes the reference frequency and N the dividing number of the frequency divider 4.

Further, if use is made of a frequency divider 4 having a programmable counter, the dividing number N becomes variable and it is possible to obtain any output frequency Fout with the frequency Fref as a unit. However, the output of the phase comparator 1 is normally produced in synchronism with the rise or fall of the reference frequency Fref. In consequence, when the multiplying ratio between the output frequency Fout and the reference frequency Fref becomes greater, a time interval from the outputting of the error signal from the phase comparator to that of the next error signal becomes longer from the standpoint of the output frequency Fout. As a result, the PLL circuit is not adequately controlled and the stability of the output frequency Fout is lowered. The extent of stability is evaluated by the phase error showing a phase shift between the reference signal Fref and the output signal Fout as well as the jitter representing a disturbance between the clocks of the output signal Fout. If, normally, the output amplitude of the lowpass filter 2 becomes greater in the PLL circuit, the phase error becomes smaller but the jitter becomes prominent. On the other hand, if the output amplitude of the lowpass filter becomes smaller, the phase error becomes greater but the jitter becomes smaller.

If the frequency of the reference signal Fref is constant, the greatest value of the multiplying ratio N of the PLL circuit is determined by the greatest oscillable frequency Fout of the VCO 3. In order to increase the multiplying ratio N, it is necessary to increase the greatest value of the VCO's output frequency Fout. This means increasing a conversion efficiency Kf (=Fout/Vcont) of the VCO 3. If, however, the conversion efficiency Kf becomes greater, the output frequency Fout of the VCO 3 varies greater when the control voltage Vcont varies due to, for example, noise. It has, therefore, been difficult to accurately control the VCO 3.

The ordinary VCO, even performing frequency control, never controls the duty ratio of the clock waveform of the output signal Fout. In the case where it is necessary to ensure 50% as the duty ratio of the clock waveform, a circuit as shown in FIG. 12 is used. Here, the same reference numerals are employed to designate parts or elements corresponding to those shown above and any further explanation is, therefore, omitted. In FIG. 12, a VCO 3 oscillates with double the frequency required. The output terminal of the VCO 3 is connected to the input terminal of a divide-by-2 frequency divider 8 and the output terminal of the frequency divider 8 is connected to the input terminal of a frequency divider 4. The output signal of the frequency divider 8 becomes a clock signal whose duty ratio is 50%. Since, in this case, the conversion efficiency Kf of the VCO 3 becomes still greater, it becomes difficult to control the VCO 3.

Further, if the multiplying ratio N of the PLL circuit becomes greater, a reference frequency Fref of the PLL circuit, being compared with an output frequency Fout of the VCO 3, becomes a considerably low one. When the reference frequency Fref becomes a lower one, the control period of a phase comparator 1 for controlling the VCO 3 becomes longer, thus making it difficult to accurately control the VCO 3.

In the case where the PLL circuit is built on an LSI chip, it is necessary to provide a margin two to three times the lock range required, taking that process variation into consideration. It is, therefore, difficult, in practice, to increase the stability of the PLL circuit by lowering the conversion coefficient of the VCO.

Further, the multiplier suffers a greater influence from noise from other circuits on the chip, such as a digital circuit system in particular to the PLL circuit. It is thus difficult to operate the PLL circuit stably.

If, in this way, the multiplying ratio N of the PLL circuit becomes greater, the stability of the oscillation frequency is lowered, resulting in a lowering in the phase error characteristic as well as in a jitter characteristic.

BRIEF SUMMARY OF THE INVENTION

It is accordingly the object of the present invention to provide a frequency multiplying circuit which can obtain a multiplying ratio of a few thousands of times as great and, even if increasing the multiplying ratio, can generate an output frequency of less jitter and high stability.

The object of the present invention is achieved by the following arrangement.

A frequency multiplying circuit of the present invention comprises a plurality of series-connected frequency multipliers in which the multiplying ratio of the initial stage frequency multiplier is the greatest with respect to the remaining frequency multiplier or multipliers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing a frequency multiplying circuit according to a first embodiment of the present invention;

FIG. 2 shows a frequency multiplier in the first embodiment of the present invention;

FIG. 3 shows a timing chart of a frequency multiplier in FIG. 2;

FIG. 4 shows a voltage controlled delay circuit and its control circuit in the embodiment of the present invention;

FIG. 5 is a view showing a circuit of a phase comparator used in the embodiment of the present invention;

FIG. 6 is a view showing the frequency multiplier used in the present invention;

DETAILED DESCRIPTION OF THE INVENTION

Figure 7:
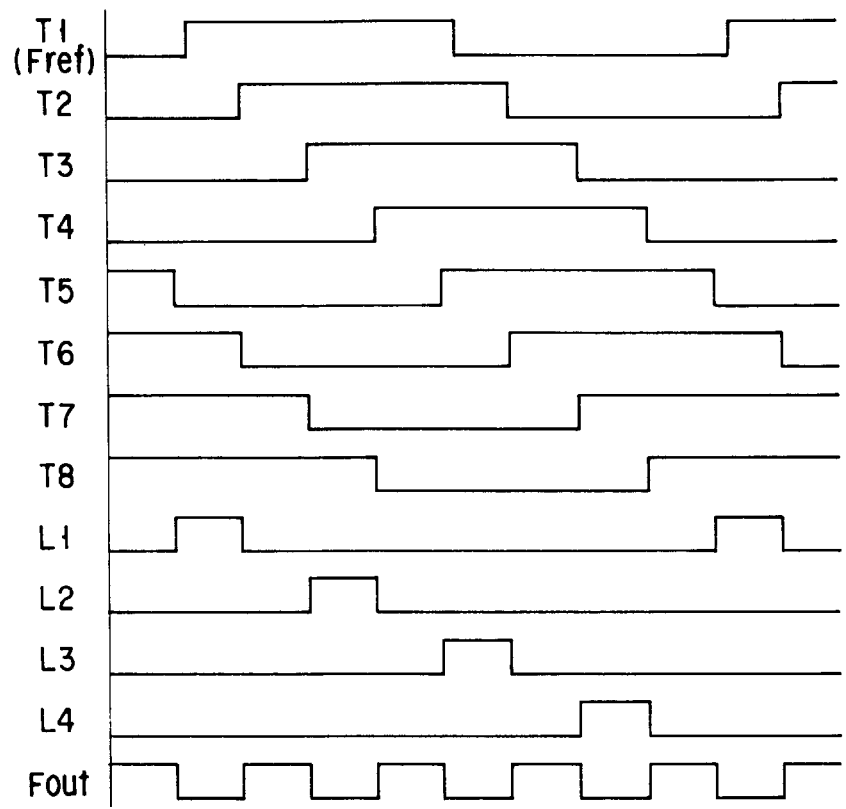
FIG. 7 shows a timing chart showing the frequency multiplier shown in FIG. 6.

The embodiments of the present invention will be explained below with reference to the accompanying drawing.

FIG. 1 shows a first embodiment of the present invention. A reference signal Fref is supplied to the input terminal of an N multiplying frequency multiplier 10. The frequency multiplier 10 generates an output signal N×Fref. The output signal of the frequency multiplier 10 is supplied to the input terminal of an M multiplying frequency multiplier 11. The frequency multiplier 11 outputs an M×N×Fref signal Fout.

In the present embodiment, at least one of these frequency multipliers is comprised of a frequency multiplier as shown in FIG. 2 or FIG. 6.

FIG. 2 shows a first practical form of a frequency multiplier for use in FIG. 1. FIG. 3 shows an operation timing of the frequency multiplier shown in FIG. 2. The multiplying ratio of the frequency multiplier shown in FIG. 2 is set to be, for example, 4. The frequency multiplier comprises a voltage controlled delay circuit 12, phase comparator 14, lowpass filter 15, inverter 13 and synthesizing circuit 51.

A reference signal Fref is supplied to the input terminal of the voltage controlled delay circuit 12. The voltage controlled delay circuit 12 outputs a delayed replica of the reference signal Fref corresponding to a control voltage Vcont.

FIG. 4 shows one practical form of the voltage controlled delay circuit.

The voltage controlled delay circuit is comprised of a control circuit 32 and cascade-connected delay circuits 33-1 to 33-N. The control circuit 32 generates signals VPC and VNC for controlling a delay amount of the delay circuits 33-1 to 33-N in accordance with a control voltage Vcont supplied from the lowpass circuit 15. Each of the delay circuits 33-1 to 33-N is comprised of an inverter 33a for controlling a delay time and an output buffer inverter 33b. In the inverter 33a, control signals VPC and VNC from the control circuit 32 are supplied to the corresponding gates of control transistors MP1 and MN1, respectively. In accordance with the control signals VPC and VNC, the control transistors MP1 and MN1 control the maximum values of electric currents therethrough. When the maximum value of the electric current is increased the delay time in the inverter 33a is decreased. When, on the other hand, the maximum value of the electric current there is decreased, the delay time in the inverter 33a is increased. Those delay signals from the delay circuits 33-1 to 33-N are supplied, respectively, through the output buffer inverters 33b to intermediate terminals T1, T2, . . . TN. Further, the delay signal from the respective inverter 33a is supplied to the input terminal of the inverter 33a constituting a sequential stage of the delay circuit.

Since the multiplying ratio of the frequency multiplier shown in FIG. 2 is set to be 4, the voltage controlled delay circuit 12 has intermediate terminals T1 to T4. Between the adjacent intermediate terminals are provided an equal number of delay circuits. In consequence, the intermediate terminals T1 to T4 produce delay signals, that is, signals delayed behind the input signal of the voltage controlled delay circuit 12 in units of a time corresponding to ¼ the delay amount between the output signal and the input signal of the voltage controlled delay circuit.

As shown in FIG. 2, the output signal of the voltage controlled delay circuit is supplied to a first input terminal of the phase comparator 14. Further, the reference signal Fref is supplied through the inverter 13 to the second input terminal of the phase comparator 14. The phase comparator 14 detects the phase difference between the two to produce an error signal Verr corresponding to the phase difference.

FIG. 5 shows a practical circuit of the phase comparator. As the phase comparator use is made of a known phase comparator.

Further, the error signal Verr is supplied to the input terminal of the lowpass filter 15. The lowpass filter 15 produces a signal Vcont, that is, a signal obtained by the integration of the error signal Verr. The signal Vcont is supplied to a control voltage input terminal of the voltage controlled delay circuit 12.

The synthesizing circuit 51 comprises exclusive NOR gates 16, 17 and NAND gate 18. The intermediate terminals T1, T2 are connected to the first and second input terminals of the exclusive NOR gate 16 and an output terminal L1 of the exclusive NOR gate 16 is connected to the first input terminal of the NAND gate 18. The intermediate terminals T3 and T4 are connected to the first and second input terminals of the exclusive NOR gate 17. An output terminal L2 of the exclusive NOR gate 17 is connected to the second input terminal of the NAND gate 18. The output signal Fout of the NAND gate 18 becomes a 4× multiplied signal with respect to the reference signal Fref.

Now the operation of the present circuit will be explained below.

When the output signal of the voltage controlled delay circuit 12 is delayed behind the phase of an inverted replica of the reference signal Fref, the phase comparator 14 outputs a high level pulse of a period corresponding to the phase difference. Let it be assumed that the lowpass filter 15 is comprised of, for example, a capacitor C and resistor R. At this time, the level of an output voltage from the lowpass filter 15 goes higher than the previous voltage level. And the voltage controlled delay circuit 12 controlled by a voltage Vcont allows a delay amount to be decreased in that delay circuit. When, on the other hand, the output signal of the voltage controlled delay circuit 12 has its phase go ahead of an inverted signal of the reference signal Fref, the phase comparator 14 outputs a low level pulse of a period corresponding to the phase difference, so that the output voltage level of the lowpass filter 15 goes lower than its previous level and hence the voltage controlled delay circuit 12 increases a delay amount in the circuit.

In this way, the loop compares the output signal of the voltage controlled delay circuit with the inverted replica of the reference signal Fref, any number of times, in terms of their phases and so operate as to cancel their phase difference. When a phase coincidence is achieved finally between the two, the output of the phase comparator 14 is placed in a high impedance state. And the output voltage of the lowpass filter 15 maintains its previous voltage level and the voltage controlled delay circuit 12 also maintains its previous delay amount. In this state, a delay amount from the input terminal to the output terminal of the voltage controlled delay circuit 12 coincides with one half the period of the reference signal Fref.

Thus, the intermediate terminal T1 in the voltage controlled delay circuit 12 produces the reference signal Fref, the intermediate terminal T2 produces an output signal delayed behind the reference signal Fref in a time unit of ⅛ the period of the reference signal Fref, the intermediate terminal T3 produces an output signal delayed behind the reference signal Fref in a time unit of ⅖ the period of the reference signal Fref and the intermediate terminal T4 produces an output signal delayed behind the reference signal Fref in a time unit of ⅜ the period of the reference signal.

With the use of signal outputs from the intermediate terminals T1 to T4, the synthesizing circuit 51 produces a 4× multiplied signal with respect to the reference signal Fref.

In this way, an n number of intermediate signals are taken out of the N (or more)-stage voltage controlled delay circuit and, with a combination of N/2 exclusive OR circuits with a logic circuit for adding corresponding output signals, it is possible to construct an N multiplying logic circuit for producing an N multiplied signal with respect to the reference signal Fref.

FIG. 6 shows a second practical form of the frequency multiplier used in the present invention. The multiplying ratio of the frequency circuit as shown in FIG. 6 is set to be, for example, 4. This frequency multiplier comprises a voltage controlled delay circuit 19, phase comparator 20, lowpass filter 21 and synthesizing circuit 52.

A reference signal Fref is supplied to the input terminal of the voltage controlled delay circuit 19. The voltage controlled delay circuit 19 produces an output signal delayed behind the input signal Fref in accordance with a control voltage Vcont. The voltage controlled delay circuit 19 is comprised of, as shown in FIG. 4, a plurality of series-connected delay circuits having their delay times controlled by the control voltage Vcont. Further, the voltage controlled delay circuit 19 has intermediate terminals T1 to T8 producing a signal delayed behind its input signal in units of a time corresponding to ⅛ the delay amount between an input signal and an output signal of the voltage controlled delay circuit. In the voltage controlled delay circuit 19, an equal stage number of delay circuits are provided between the adjacent intermediate terminals.

The output signal of the voltage controlled delay circuit 19 is supplied to the first input terminal of the phase comparator 20. Further, the reference signal Fref is supplied to the second input terminal of the phase comparator 20. The phase comparator 20 detects the phase difference of the two input signals and outputs an error signal Verr corresponding to the phase difference. FIG. 5 shows a practical circuit of the phase comparator 20.

The error signal Verr is supplied to the input terminal of the lowpass filter 21. The lowpass filter 21 produces a signal Vcont corresponding to an integrated error signal Verr and the signal Vcont is supplied to a control voltage input terminal of the voltage controlled delay circuit 19.

The synthesizing circuit 52 is comprised of RS flip-flops 22 to 25 and NOR gate 26. The intermediate terminals T1 and T2 of the voltage controlled delay circuit 19 are connected to an S input terminal and R input terminal of the RS flip-flop 22 comprised of, for example, two NOR gates. In the same way, the intermediate terminals T3, T4, . . . , T7, T8 are connected to the corresponding S and R input terminals of the RS flip-flops 23, . . . , 25. The Q output terminals L1 . . . L4 of the RS flip-flops 22 to 25 are connected to the first to fourth input terminals of the NOR gate 26. The NOR gate 26 provides an output signal Fout corresponding to 4 times the frequency of the reference signal Fref.

In the circuit arrangement above, under negative feedback control by a loop including the voltage controlled delay circuit 19, phase comparator 20 and lowpass filter 21, a delay amount between the input signal and the output signal of the voltage controlled delay circuit 19 finally becomes equal to one cycle of the reference signal Fref. In this state, it is possible to provide a 4× multiplied signal Fout with respect to the frequency of the reference signal Fref. FIG. 7 shows a timing chart showing the operation of the frequency multiplying circuit.

In this way, a 2N number of intermediate output signals are taken out of the voltage controlled delay circuit comprised of 2N stage (or more) delay circuits to control an N number of RS flip-flop circuits and an N multiplying logic circuit adds together the output signals of these RS flip-flop circuits, whereby an N frequency multiplier can be provided for producing an N multiplied output signal with respect to the frequency of the reference signal. Since, in the circuit arrangement above, a multiplied signal is produced with only the rises of the output signals of the intermediate terminals T1 . . . T8, it is possible to readily obtain a multiplied signal of a 50% duty cycle.

The FIG. 1 embodiment using the frequency multiplier including the voltage controlled delay circuit shown in FIGS. 2 and 6 will be explained below in conjunction with its advantages.

First, in the ordinary VCO including a voltage controlled delay circuit connected in a ring-like fashion, the delay amount is so set as to have a total delay amount of one half cycle of a high-frequency output signal Fout. In contrast with the PLL circuit including the voltage controlled delay circuit as shown in FIGS. 2 and 6, the delay amount may be so set as to have a total delay amount of one-half or one cycle the low-frequency reference signal Fref.

Further, in the case of the VCO, in order to obtain a desired output frequency, it is necessary to secure a variation width of a given extent for the delay amount. In the case of the circuit arrangement shown in FIG. 2 or FIG. 6, on the other hand, it is only necessary to set the total delay amount to be one-half or one cycle of the reference frequency Fref and it is, therefore, only necessary to secure, for the delay amount, a variation width of an extent compensating for a process variation.

In the PLL circuit comprised of a voltage controlled delay circuit, it is possible to narrow the variation width of the frequency varied by the control voltage.

That the variation width of the frequency is smaller in the PLL circuit comprised of a voltage controlled delay circuit indicates that the variation coefficient of the delay amount per stage of the voltage controlled delay circuit, that is, the variation level of the delay amount with respect to a variation amount of the control voltage, is smaller in the voltage controlled delay circuit than the voltage controlled oscillator. If the variation coefficient of the delay amount is smaller, the variation of the output frequency is smaller even in the case where the control voltage varies due to noise, etc., so that the stability of the output frequency is increased.

Further, the voltage controlled delay circuit for controlling a low frequency signal can achieve readier control than the voltage controlled oscillator for controlling a high frequency signal. In the case where the frequency multiplier is to be built on the chip of an LSI for instance, it is considered better to build it with the use of the voltage controlled delay circuit whose output frequency has a high stability.

According to the present invention, the frequency multiplying circuit is achieved by connecting a plurality of frequency multipliers in series array. If this is the case, then it is necessary to provide a 1000 stage or higher voltage controlled delay circuits and 500 exclusive NOR circuits when a frequency multiplying circuit of an about 1000× multiplying ratio is built with the use of one voltage controlled delay circuit. As a result, the size of the circuit becomes greater and a cost problem arises when it is built on the LSI chip. If, however, use is made of, as shown in FIG. 1, a plurality of frequency multipliers of a relatively low multiplying ratio including, for example, the voltage controlled delay circuit and cascade-connected together, it is possible to relatively readily provide a multiplied signal whose multiplying ratio is a few thousands with respect to the reference frequency.

Figure 8A:
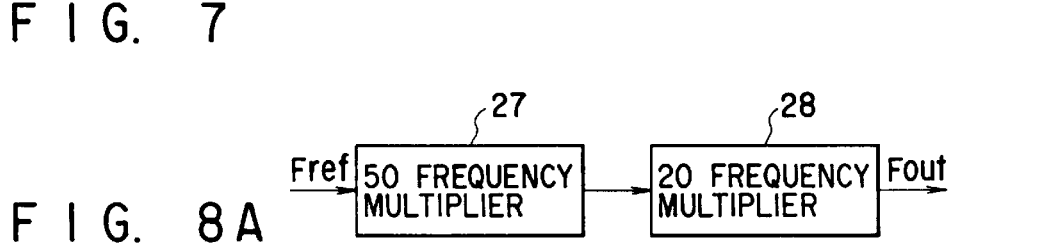
FIGS. 8A and 8B are practical forms according to the first embodiment of the present invention.
Figure 8B:
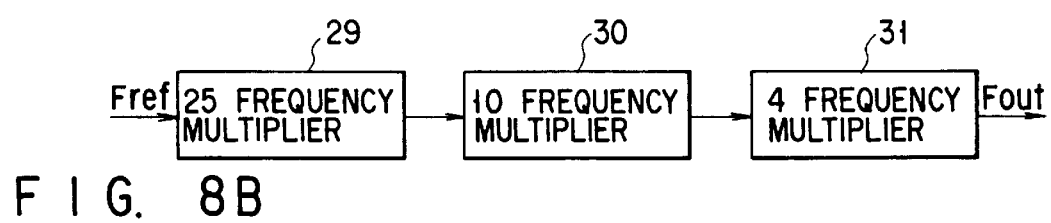

FIGS. 8A and 8B show practical forms of the first embodiment which provide an output frequency whose multiplying ratio is 1000 with respect to the reference input frequency, the practical form of FIG. 8A showing a two stage frequency multiplying circuit and the practical form of FIG. 8B a three stage frequency multiplying circuit.

In the practical form as shown in FIG. 8A, a reference signal Fref is supplied to a 50× frequency multiplier 27 of a 50× multiplying ratio and the output signal of the frequency multiplier 27 is supplied to the input terminal of a 20× frequency multiplier 28 of a 20 multiplying ratio. The frequency multiplier 28 provides an output signal Fout as a 1000× multiplying signal with respect to the reference signal Fref.

In the practical form as shown in FIG. 8B, the reference signal Fref is supplied to the input terminal of a 25× frequency multiplier 29 of a 25× multiplying ratio and the output signal of the frequency multiplier 29 is supplied to the input terminal of a 10× frequency multiplier 30 of a 10 multiplying ratio and the output signal of the frequency multiplier 30 is supplied to the input terminal of a 4× frequency multiplier 31 of a 4× multiplying ratio. The frequency multiplier 31 provides an output signal Fout as a 1000× multiplying signal with respect to the reference signal Fref.

In these practical forms, the multiplying number of the initial stage frequency multiplier is made greater than that of the subsequent stage frequency multiplier, the reason of which is as will be set out below.

First, the initial stage frequency multiplier receives the input reference signal and, in view of the input reference signal being lower in frequency, it is necessary that, in order to allow a delay amount which corresponds to one half or one cycle of the reference signal to be achieved with the voltage controlled delay circuit, the delay time per stage of the voltage controlled delay circuit be made greater. If this is the case, then the waveform inclination of a signal transmitted over the delay circuit becomes smaller and jitter is liable to be produced. Further, a shorter delay time at the first stage enables a waveform to be obtained with less distortion. The jitter performance of the first stage frequency multiplier exerts a great influence over the performance of the final output frequency. It is, therefore, requested that the jitter performance of the initial stage frequency multiplier be enhanced by decreasing the delay time per stage of the voltage controlled delay circuit, that is, increasing the multiplying ratio.

Since, in the subsequent stage frequency multiplier, the frequency of the input signal is made lower than that of the reference signal Fref, the delay time per stage of the voltage controlled delay circuit can be made small compared with the initial stage frequency multiplier. It is, therefore, not positively necessary that the multiplying ratio be made large so as to secure the jitter performance as in the case of the initial stage.

It is preferred that the multiplying ratio of the initial stage frequency multiplier be made greater than that of the subsequent stage frequency multiplier.

Figure 9:
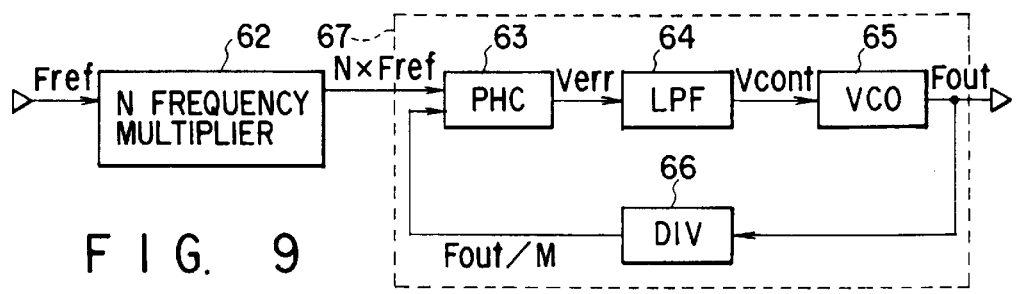
FIG. 9 shows a circuit arrangement showing a second embodiment of the present invention.

FIG. 9 shows a frequency multiplying circuit according to a second embodiment of the present invention. The frequency multiplier circuit comprises an initial stage N frequency multiplier 62 and subsequent M frequency multiplier 67.

As the initial stage N frequency multiplier use is made of the frequency multiplier shown in FIG. 2 or FIG. 6. The reference signal Fref is supplied to the input terminal of the frequency multiplier 62 and the frequency multiplier 62 produces an N multiplying signal N×Fref.

The subsequent stage M frequency multiplier 67 comprises a phase comparator 63, lowpass filter 64, VCO 65 and frequency divider 66.

The frequency multiplier 62 supplies the N multiplying signal N×Fref to the first input terminal of the phase comparator 63 and the frequency divider 66 supplies a frequency divided signal Fout/M to the second input terminal of the phase comparator 63. The phase comparator 63 outputs an error signal Verr.

The error signal Verr is supplied to the input terminal of the lowpass filter 64. The lowpass filter 64 outputs a control voltage Vcont.

The control voltage Vcont is supplied to the input terminal of the VCO 65. The VCO 65 outputs a signal Fout in accordance with the control voltage Vcont.

The signal Fout is supplied to the input terminal of the frequency divider 66 and the frequency divider 66 outputs an M frequency divided signal Fout/M, noting that M represents a frequency division ratio of the frequency divider 66.

The frequency of the signal Fout from the frequency multiplier 67 is N×M×Fref, noting that the frequency of the reference signal Fref is represented by Fref.

Even in the frequency multiplier using the VCO, the oscillation signal Fout can be controlled stably and accurately in the case where the frequency of the reference signal supplied to the frequency multiplier 67 is higher to some extent and frequency division ratio of the frequency divider 66 is relatively smaller. If, therefore, in the present embodiment, an accurate and stable circuit is used for the initial stage frequency multiplier and the subseqnent stage frequency multiplier supplied with a high frequency signal comprises the phase comparator, lowpass filter, VCO and frequency divider, it is possible to obtain an accurate and stable multiplied signal Fout.

Figure 10A:
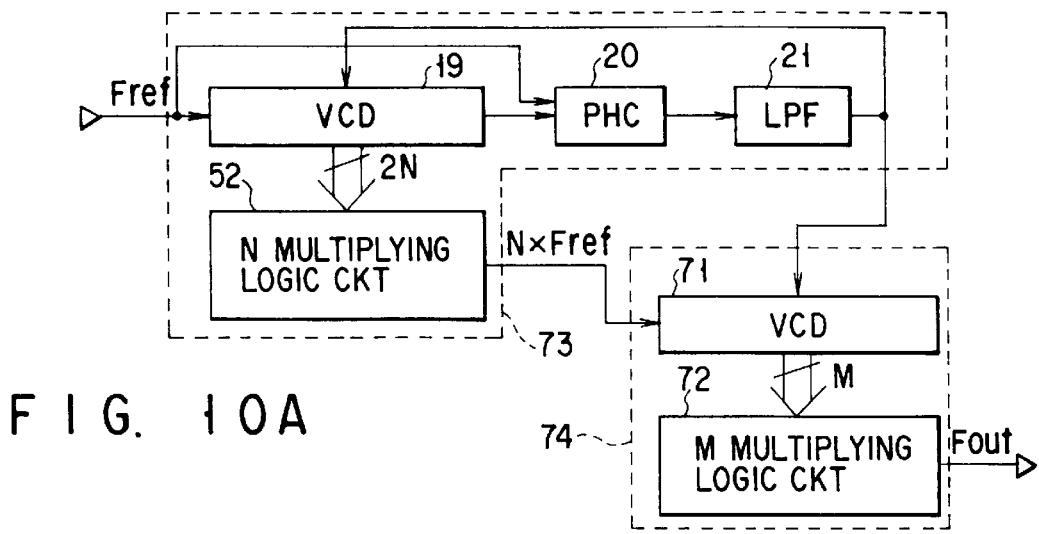
FIGS. 10A and 10B show practical forms of a frequency multiplying circuit according to a third embodiment of the present invention.

FIG. 10A shows a practical form of a frequency multiplying circuit according to a third embodiment of the present invention.

This frequency multiplying circuit comprises an initial stage frequency multiplier 73 and subsequent stage frequency multiplier 74.

In the embodiment shown in FIG. 10A, the initial stage frequency multiplier 73 supplied with a reference signal Fref has the same circuit arrangement as the frequency multiplier shown in FIG. 6. That is, the frequency multiplier 73 comprises a voltage controlled delay circuit 19, phase comparator 20, lowpass filter 21, and N multiplying logic circuit 52 composed of RS flip-flops and NOR circuit. The N multiplying logic circuit 52 in the frequency multiplier 73 outputs an N multiplying signal N×Fref of the reference signal Fref.

The second frequency multiplier 74 comprises a voltage controlled delay circuit 71 and M multiplying logic circuit 72.

The voltage controlled delay circuit 71 is supplied, at its input terminal, with an N multiplying signal N×Fref and connected, at its control voltage input terminal, to the output terminal of the lowpass filter 21. The voltage controlled delay circuit 71 outputs an M number of delay signals delayed behind the input N multiplying signal N×Fref in units of a time corresponding to 1/M the delay time of a delay circuit between those adjacent intermediate terminals of the voltage controlled delay circuit 19.

The M number of delay signals from the voltage controlled delay circuit 71 are supplied to an M number of input terminals of an M multiplying logic circuit 72 and the M multiplying logic circuit 72 outputs an M multiplying signal based on the N multiplying signal N×Fref. The M multiplying logic circuit 72 comprises, as shown in FIG. 2 for instance, exclusive NOR gates and NAND gate.

The circuit arrangement of the present embodiment controls the second voltage controlled delay circuit 71 with the use of a control voltage of the initial stage frequency multiplier. In order to secure the multiplying ratio M of the subsequent stage frequency multiplier, the delay amount per stage of the delay circuit of the subsequent stage voltage controlled delay circuit 71, for example, is set to be 1/M the delay amount per stage of the delay circuit of the initial stage voltage controlled delay circuit 19. As a result, it is possible to reduce the circuit size and achieve a low manufacturing cost.

Figure 10B:
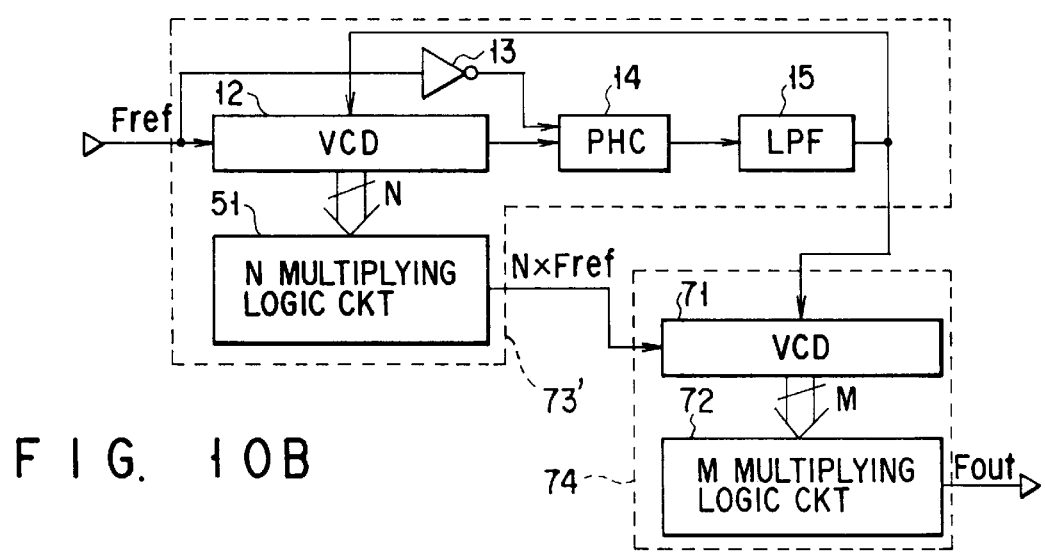
Figure 11:
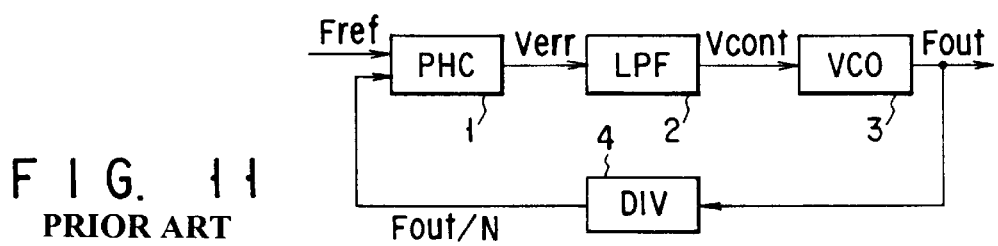
FIG. 11 is a block diagram showing a conventional PLL circuit.
Figure 12:
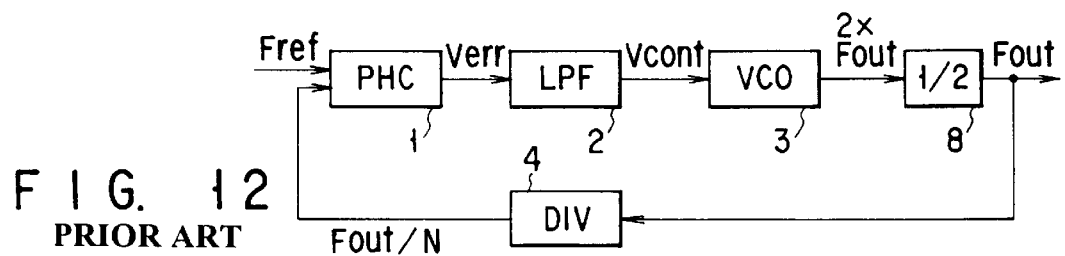
FIG. 12 is a block diagram showing a conventional PLL circuit for obtaining an output signal of a 50% duty ratio.

In the embodiment shown in FIG. 10A, the initial stage frequency multiplier as shown in FIG. 10B may be made the same circuit as shown in FIG. 2, that is, as shown in FIG. 10B. The second frequency multiplier may be so formed as to comprise a voltage controlled delay circuit having a 2M number of intermediate terminals and 2M number of series-connected delay circuits having a delay amount corresponding to 1/M the delay amount per stage of the initial stage and an M frequency multiplying circuit comprised of, as shown in FIG. 6, an M number of RS flip-flops and an adder. Needless to say, a subsequent third frequency multiplier may be so formed as to have the same arrangement as that of the second frequency multiplier.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit receiving a first reference signal at an input terminal and producing a delay signal from an output terminal and having an N number of intermediate terminals producing a signal delayed behind the first reference signal in units of a time corresponding to 1/N of the delay time between the first reference signal and the delay signal;

a phase comparator supplied at a first input terminal with an inverted signal of the first reference signal and at a second input terminal with the delay signal and producing an error signal corresponding to a phase difference between the delay signal and the inverted signal;

a lowpass filter supplied at an input terminal with the error signal and connected at an output terminal to a control voltage input terminal of the voltage controlled delay circuit; and an N multiplying logic circuit connected at input terminals to the N number of intermediate terminals and producing an N multiplied signal of the first reference signal;

wherein said at least one of the plurality of multipliers is said first stage frequency multiplier; and wherein at least one of the subsequent frequency multiplier or multipliers comprises:

a voltage controlled oscillator producing an oscillation signal;

a frequency divider supplied at an input terminal with the oscillation signal and producing a frequency divided signal of the oscillation signal;

a phase comparator supplied at a first input terminal with the frequency divided signal and at a second input terminal with a second reference signal as the N multiplied signal of the first reference signal and producing an error signal corresponding to a phase difference between the second reference signal and the frequency divided signal; and a lowpass filter supplied at an input terminal with the error signal and connected at an output terminal to a control voltage input terminal of the voltage controlled oscillator.

2. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit receiving a first reference signal at an input terminal and producing a delay signal from an output terminal and having an N number of intermediate terminals producing a signal delayed behind the first reference signal in units of a time corresponding to 1/N of the delay time between the first reference signal and the delay signal;

a phase comparator supplied at a first input terminal with an inverted signal of the first reference signal and at a second input terminal with the delay signal and producing an error signal corresponding to a phase difference between the delay signal and the inverted signal;

a lowpass filter supplied at an input terminal with the error signal and connected at an output terminal to a control voltage input terminal of the voltage controlled delay circuit; and an N multiplying logic circuit connected at input terminals to the N number of intermediate terminals and producing an N multiplied signal of the first reference signal;

wherein said at least one of the plurality of frequency multipliers is said first stage frequency multiplier; and wherein the subsequent frequency multiplier or multipliers comprises:

a voltage controlled delay circuit supplied at an input terminal with a multiplied signal from a preceding stage frequency multiplier and connected at a control input to a lowpass filter of the first stage frequency multiplier and having intermediate terminals producing a signal delayed behind the multiplied signal from the preceding stage frequency multiplier in units of a time corresponding to 1/M of the cycle of the preceding stage multiplied signal; and an M multiplying logic circuit connected at an input terminal side to the intermediate terminals of the voltage controlled delay circuit and producing an M multiplied signal of the multiplied signal output from the preceding stage frequency multiplier.

3. The frequency multiplying circuit according to claim 1, wherein the N multiplying logic circuit comprises:

N/2 exclusive NOR circuits connected at a first input terminal to a corresponding one of the intermediate terminals and at a second input terminal to the adjacent intermediate terminal producing a signal delayed behind a signal on said corresponding one of the intermediate terminals in a unit of a time corresponding to 1/N of said delay time; and an NAND circuit having N/2 input terminals connected to output terminals of the N/2 exclusive NOR circuits and producing the N multiplied signal.

4. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit supplied at an input terminal with a first reference signal and producing a delay signal from an output terminal and having a 2N number of intermediate terminals producing a signal delayed behind the first reference signal in units of time corresponding to ½N of the delay time between the first reference signal and the delay signal;

a phase comparator supplied at a first input terminal with the delay signal and at a second input terminal with the first reference signal and producing an error signal corresponding to a phase difference between the delay signal and the first reference signal;

a lowpass filter supplied at an input terminal with the error signal and connected at an output terminal to a control voltage input terminal of the voltage controlled delay circuit; and an N multiplying logic circuit having a 2N input terminals and producing an N multiplied signal of the reference signal with only a rise or fall of the input signals;

wherein said at least one of the plurality of frequency multipliers is the first stage frequency multiplier;

and the subsequent frequency multiplier or multipliers comprises:

a voltage controlled oscillator for producing an oscillation signal;

a frequency divider supplied at an input terminal with the oscillation signal and producing a frequency divided signal of the oscillation signal;

a phase comparator supplied at a first input terminal with the frequency divided signal and at a second input terminal with a second reference signal as the N multiplied signal of the first reference signal and producing an error signal corresponding to a phase difference between the second reference signal and the frequency divided signal; and a lowpass filter supplied at an input terminal with the error signal and connected at an output terminal to a control voltage input terminal of the voltage controlled oscillator.

5. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit supplied at an input terminal with a first reference signal and producing a delay signal from an output terminal and having a 2N number of intermediate terminals producing a signal delayed behind the first reference signal in units of time corresponding to ½ N of the delay time between the first reference signal and the delay signal;

a phase comparator supplied at a first input terminal with the delay signal and at a second input terminal with the first reference signal and producing an error signal corresponding to a phase difference between the delay signal and the first reference signal;

a lowpass filter supplied at an input terminal with the error signal and connected at an output terminal to a control voltage input terminal of the voltage controlled delay circuit; and an N multiplying logic circuit having a 2N input terminals and producing an N multiplied signal of the reference signal with only a rise or fall of the input signals;

wherein said at least one of the plurality of frequency multipliers is the first stage frequency multiplier; and wherein the subsequent stage frequency multiplier or multipliers comprises:

a voltage controlled delay circuit supplied at an input terminal with the multiplied signal from a preceding stage frequency multiplier and connected at a control voltage input terminal to an output terminal of the lowpass filter in the first stage frequency multiplier and having intermediate terminals producing a signal delayed behind the preceding stage multiplied signal in units of a time corresponding to ½M of the cycle of the preceding stage multiplied signal; and an M multiplying logic circuit connected at an input terminals to the intermediate terminals of the voltage controlled delay circuit and producing an M multiplied signal of the preceding stage multiplied signal.

6. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit supplied at an input terminal with a first reference signal and producing a delay signal from an output terminal and having a 2N number of intermediate terminals producing a signal delayed behind the first reference signal in units of time corresponding to ½N of the delay time between the first reference signal and the delay signal;

a phase comparator supplied at a first input terminal with the delay signal and at a second input terminal with the first reference signal and producing an error signal corresponding to a phase difference between the delay signal and the first reference signal;

a lowpass filter supplied at an input terminal with the error signal and connected at an output terminal to a control voltage input terminal of the voltage controlled delay circuit; and an N multiplying logic circuit having a 2N input terminals and producing an N multiplied signal of the reference signal with only a rise or fall of the input signals; wherein the N multiplying logic circuit comprises:

an N number of RS flip-flop circuits connected at a first input terminal to a corresponding one of the intermediate terminals and at a second input terminal to the adjacent intermediate terminal producing a signal delayed behind the signal on the first input terminal in a unit of time corresponding to ½N of said delay time; and a NOR circuit connected at N input terminals to output terminals of the N number of RS flip-flop circuits and producing the N multiplied signal.

7. A circuit according to claim 1, wherein said voltage controlled delay circuit comprises:

a control circuit for generating a control signal in accordance with the control voltage supplied from said lowpass filter; and a plurality of delay circuits which are connected in series, each of said delay circuits having one of the intermediate terminals, wherein each of said delay circuits delays the first reference signal in order in accordance with the control signal supplied from the control circuit and outputs the delayed first reference signal to a corresponding one of the intermediate terminals.

8. A circuit according to claim 7, wherein each of said delay circuits includes an inverter circuit for controlling a delay time of the first reference signal in accordance with the control signal supplied from the control circuit.

9. A circuit according to claim 2, wherein said voltage controlled delay circuit comprises:

a control circuit for generating a control signal in accordance with the control voltage supplied from said lowpass filter; and a plurality of delay circuits which are connected in series, each of said delay circuits having one of the N number of intermediate terminals, wherein each of said delay circuits delays the first reference signal in order in accordance with the control signal supplied from the control circuit and outputs the delayed first reference signal to a corresponding one of the N number of intermediate terminals.

10. A circuit according to claim 9, wherein each of said delay circuits includes an inverter circuit for controlling a delay time of the first reference signal in accordance with the control signal supplied from the control circuit.

11. A circuit according to claim 4, wherein said voltage controlled delay circuit comprises:

a control circuit for generating a control signal in accordance with the control voltage supplied from said lowpass filter; and a plurality of delay circuits which are connected in series, each of said delay circuits having one of the 2N number of intermediate terminals, wherein each of said delay circuits delays the first reference signal in order in accordance with the control signal supplied from the control circuit and outputs the delayed first reference signal to a corresponding one of the 2N number of intermediate terminals.

12. A circuit according to claim 11, wherein each of said delay circuits includes an inverter circuit for controlling a delay time of the first reference signal in accordance with the control signal supplied from the control circuit.

13. A circuit according to claim 5, wherein said voltage controlled delay circuit comprises:

a control circuit for generating a control signal in accordance with the control voltage supplied form said lowpass filter; and a plurality of delay circuits which are connected in series, each of said delay circuits having one of the 2N number of intermediate terminals, wherein each of said delay circuits delays the first reference signal in order in accordance with the control signal supplied from the control circuit and outputs the delayed first reference signal to a corresponding one of the 2N number of intermediate terminals.

14. A circuit according to claim 13, wherein each of said delay circuits includes an inverter circuit for controlling a delay time of the first reference signal in accordance with the control signal supplied from the control circuit.

15. A circuit according to claim 6, wherein said voltage controlled delay circuit comprises:

a control circuit for generating a control signal in accordance with the control voltage supplied form said lowpass filter; and a plurality of delay circuits which are connected in series, each of said delay circuits having one of the 2N number of intermediate terminals, wherein each of said delay circuits delays the first reference signal in order in accordance with the control signal supplied from the control circuit and outputs the delayed first reference signal to a corresponding one of the 2N number of intermediate terminals.

16. A circuit according to claim 15, wherein each of said delay circuits includes an inverter circuit for controlling a delay time of the first reference signal in accordance with the control signal supplied from the control circuit.

17. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit receiving a first reference signal at an input terminal and producing a delay signal from an output terminal and having an N number of intermediate terminals producing a signal delayed behind the first reference signal in units of a time corresponding to 1/N of the delay time between the first reference signal and the delay signal;

a phase comparator supplied at first input terminal with an inverted signal of the first reference signal and at a second input terminal with the delay signal and producing an error signal corresponding to a phase difference between the delay signal and the inverted signal;

a lowpass filter supplied at an input terminal with the error signal and connected at an output terminal to a control voltage input terminal of the voltage controlled delay circuit; and an N multiplying logic circuit connected at input terminals to the N number of intermediate terminals and producing an N multiplied signal of the first reference signal, wherein said voltage controlled delay circuit comprises:

a control circuit for generating a control signal in accordance with the control voltage supplied from said lowpass filter; and a plurality of delay circuits which are connected in series, each of said delay circuits having one of the N number of intermediate terminals, wherein each of said delay circuits delays the first reference signal in order in accordance with the control signal supplied from the control circuit and outputs the delayed first reference signal to a corresponding one of the N number of intermediate terminals.

18. A circuit according to claim 17, wherein each of said delay circuits includes an inverter circuit for controlling a delay time of the first reference signal in accordance with the control signal supplied from the control circuit.

19. A frequency multiplying circuit having an input and an output and comprising a plurality of frequency multipliers arranged in series between the input and the output, wherein a multiplying ratio of the first stage frequency multiplier arranged closest to the input is the greatest with respect to the subsequent frequency multiplier or multipliers, and wherein at least one of the plurality of frequency multipliers comprises:

a voltage controlled delay circuit supplied at an input terminal with a first reference signal and producing a delay signal from an output terminal and having a 2N number of intermediate terminals producing a signal delayed behind the first reference signal in units of time corresponding to ½N of the delay time between the first reference signal and the delay signal;

a phase comparator supplied at first input terminal with the delay signal and at a second input terminal with the first reference signal and producing an error signal corresponding to a phase difference between the delay signal and the first reference signal;

a lowpass filter supplied at an input terminal with the error signal and connected at an output terminal to a control voltage input terminal of the voltage controlled delay circuit; and an N multiplying logic circuit having a 2N input terminals and producing an N multiplied signal of the reference signal with only a rise or fall of the input signals, wherein said voltage controlled delay circuit comprises:

a control circuit for generating a control signal in accordance with the control voltage supplied from said lowpass filter; and a plurality of delay circuits which are connected in series, each of said delay circuits having one of the 2N number of intermediate terminals, wherein each of said delay circuits delays the first reference signal in order in accordance with the control signal supplied from the control circuit and outputs the delayed first reference signal to a corresponding one of the intermediate terminals.

20. A circuit according to claim 19, wherein each of said delay circuit includes an inverter circuit for controlling a delay time of the first reference signal in accordance with the control signal supplied from the control circuit.

* * * * *